United States Patent [19]

Kasper et al.

[11] 3,767,471

[45] Oct. 23, 1973

[54] GROUP I-III-VI SEMICONDUCTORS

[75] Inventors: Horst Manfred Kasper, Warren; Joseph Leo Shay, Marlboro; Benjamin Tell, Matawan, all of N.J.

[73] Assignee: Bell Telephone Laboratories Incorporated, Murray Hill, N.J.

[22] Filed: Sept. 1, 1971

[21] Appl. No.: 176,862

[52] U.S. Cl. .................. 148/1.5, 148/186, 148/189, 317/235 AQ

[51] Int. Cl. .............................................. H01l 7/54

[58] Field of Search ...................... 148/1.5, 189, 186, 148/175; 317/235 AQ

[56] References Cited

UNITED STATES PATENTS

| | | | |
|---|---|---|---|
| 3,145,125 | 8/1964 | Lyons | 148/175 |
| 3,290,175 | 12/1966 | Cusano et al. | 136/89 |
| 3,496,429 | 2/1970 | Robinson | 317/237 R |
| 3,549,434 | 12/1970 | Aven | 148/186 |
| 3,578,507 | 5/1971 | Chiang et al. | 148/189 X |
| 3,660,178 | 5/1972 | Takahashi et al. | 148/189 |
| 3,670,220 | 6/1972 | Kun et al. | 148/1.5 X |

OTHER PUBLICATIONS

"New Semiconductors with the Chalcopyrite Structure," Austin et al., J. Electrochem. Soc., Nov. 1956, pp. 609, 610.

*Primary Examiner*—Hyland Bizot
*Assistant Examiner*—J. M. Davis
*Attorney*—W. L. Keefauver et al.

[57] ABSTRACT

The electrical carrier concentration of Group I-III-VI compound semiconductors containing copper as the Group I element is controlled by a heat treatment in an atmosphere containing an overpressure of one or two of the constituent elements. The p-type conductivity of these semiconductors can, by this method, be controllably varied over several decades of carrier concentration and some exemplary materials have been made usefully n-type. All compounds of the class contemplated have been found to be direct band gap semiconductors and are capable of exhibiting coherent stimulated emission when optically pumped. Using these compounds and techniques, both homojunction and heterojunction lasers are contemplated from the infrared region of the spectrum, through the visible and into the ultraviolet.

19 Claims, 2 Drawing Figures

GROUP I-III-VI SEMICONDUCTORS

BACKGROUND OF THE INVENTION

1. Field of the Invention

Semiconductor devices are contemplated, whose properties are due at least in part to the ability to control the electrical carrier concentration in the material.

2. Description of the Prior Art

There exists a large literature in the field of semiconducting materials with band gap energies in the visible region of the spectrum. Many such materials have been discovered many finding use in such devices as phosphors detectors and transducers. More recently, a large portion of work in this field has been concentrated on the search for materials whose electronic properties can be tailored in order to optimize the properties of such devices. It has been especially desired to find materials which can be made both p- and n-type by suitable doping procedures. Among the materials which have been investigated are the Group II-VI compound semiconductors which have band gap energies between 1.5 and 4 electron volts. These energies correspond to the near infrared portion of the spectrum into the ultraviolet. The Group II-VI materials are largely n-type and the formation of p-n junctions for efficient carrier injection in the visible or ultraviolet members, is an unsolved problem (A. G. Fischer, *Journal of the Electrochemical Society*, Vol. 118, page 139C [1971]).

The Group III-V compound semiconductors such as GaAs and GaP possess band gaps in the midportion of the visible region of the spectrum through the infrared. The carrier concentrations in these materials are easily controlled by the introduction of dopant species. In this group GaAs, with an infrared band gap, has found use in a wide range of optical devices such as light emitting diodes and junction lasers. However, except for their use in connection with external phosphors, these devices are limited to the infrared. GaP on the other hand has a band gap in the green region of the spectrum. Green and red light emitting diodes have been produced in this material but its indirect band gap is felt to be an inherent limitation on the efficiency of these devices and disadvantageous for some other uses such as junction lasers.

Another group of materials which has received some attention is the Group I-III-VI compound semiconductors which possess energy gaps spanning the visible region of the spectrum and extending from the infrared into the ultraviolet. These materials are largely p-type or have very high resistivities. Previous attempts to dope these materials or otherwise control the electrical carrier concentrations have proven largely unsuccessful. One of the workers in these materials does report the conversion of p-type $CuInSe_2$ to n-type material by a heat treatment in cadmium vapor, a dopant species (Zhuze et al., *Soviet Physics, Technical Physics* 3, page 1925 [1958]). However, they report, there that the sign of the conductivity of these materials cannot be altered by variations in stoichiometry; that in this respect these materials are similar to the Group III-V materials; and that this similarity is supported by other physical properties of these materials. Thus, this otherwise interesting class of materials has been of little utility due, at least in part, to its lack of controllability.

SUMMARY OF THE INVENTION

A heat treatment procedure has been developed by which the conductivity of the copper-containing Group I-III-VI compound semiconductors can be varied in a controlled manner. Contrary to statements in the literature, it is postulated that this procedure operates through variation of the stoichiometry of the material either alone or in combination with the introduction of dopant species. It has been found that heat treatment of these materials in a vapor containing an overpressure of at least one of the cation species makes these materials more n-type whereas heat treatment in a vapor possessing an overpressure of the anion species makes the material more p-type. By such heat treatment, the p-type conductivity of each of the contemplated materials has been varied over several orders of magnitude and some exemplary narrower band gap members of the group have even been made usefully n-type.

Utilizing this ability to control the carrier concentration of these materials, a wide range of semiconductor devices are contemplated. Among these are point contact and surface barrier diodes, homojunction diodes (in those materials which can be made both p- and n-type) and heterojunction diodes (using these materials together with other materials such as the Group II-VI semiconductors). Since all of the group I-III-VI materials have been found by the inventors to be direct band gap semiconductors with narrow line luminescence and all are capable of coherent stimulated emission when optically pumped, the development of junction lasers spanning the visible region of the spectrum into the ultraviolet is suggested.

DETAILED DESCRIPTION OF THE INVENTION

The Materials

Figure 1:
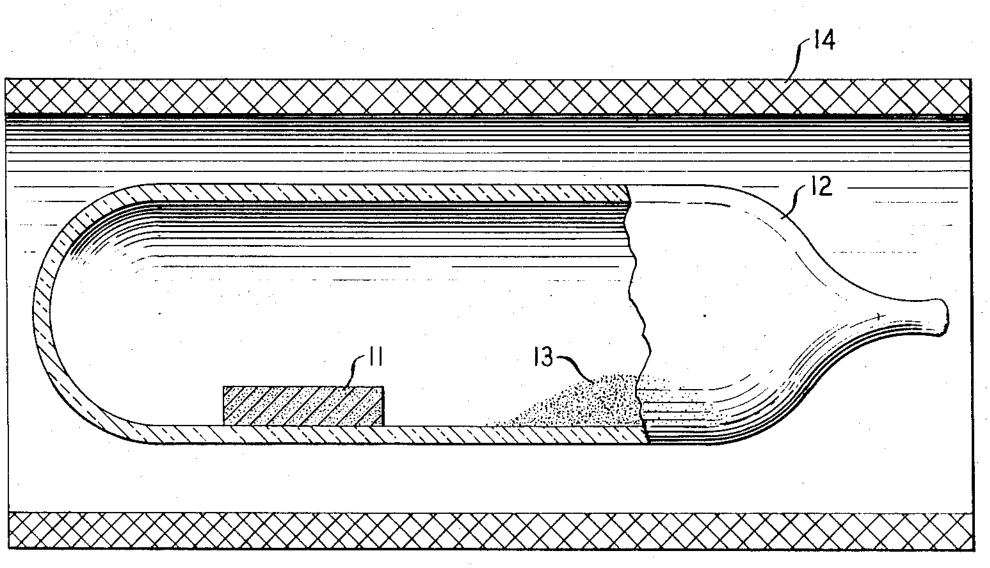
FIG. 1 is an elevational view in section of an exemplary heat treatment apparatus useful in the operation of the disclosed process.

The Group I-III-VI compound semiconductors contemplated in the invention contain the Group I element, copper; at least one Group III element selected from aluminum, gallium, and indium; and one of the Group VI elements, sulphur, selenium, or telurium. The band gap energies of these materials have been reported as spanning the visible region of the spectrum from the infrared into the ultraviolet. In addition, it has been found by high resolution optical reflection and luminescent experiments that these materials all possess direct band gaps and narrow line, near band gap luminescence. Table I shows the contemplated materials and their measured properties.

TABLE I

| Material | Band Gap Energy | Band Gap Color |
|---|---|---|
| $CuAlS_2$ | 3.4 ev | 3600A - UV |
| $CuAlSe_2$ | 2.7 ev | 4500A - blue |
| $CuGaS_2$ | 2.5 ev | 5000A - green |
| $CuGaSe_2$ | 1.8 ev | 7500A - red |
| $CuInS_2$ | 1.5 ev | 8200A - IR |
| $CuGaTe_2$ | 1.0 ev | 12300A - IR |
| $CuInTe_2$ | .95 ev | 13000A - IR |
| $CuInSe_2$ | 0.8 ev | 15000A - IR |
| $CuAlTe_2$ | 2.0 ev | 6200A - orange |

Materials with band gaps intermediate these compounds are obtainable by making partial substitutions among the Group III elements.

These properties are favorable for laser action. Indeed, two exemplary materials in which laser action has been observed are $CuGaS_2$ and $CuInS_2$. Junction lasers spanning the visible region of the spectrum from the infrared into the ultraviolet require the formation of efficient homojunctions or heterojunctions. The operation of such laser diodes as well as other devices such as detectors, electroluminescent diodes and transducers also depends on the ability to control the electrical carrier concentration in these Group I-III-VI materials.

The Control Of Carrier Concentration

The method developed to control the carrier concentration in the Group I-III-VI compound semiconductors containing copper involves heat treating these materials in a vapor containing an overpressure of one or two of the constituent elements. By this method the carrier concentrations of all of the contemplated materials have been made to vary over several orders of magnitude of p-type conductivity. In addition, two of the materials with the lowest energy gaps have been made usefully n-type When one of these materials is heat treated at a temperature between 35 and 85 percent of their melting points on the centigrade scale in a vapor containing an overpressure greater than 10 percent of the saturation pressure of the anion (the Group VI constituent) and for a time greater than two minutes, the conductivity of the material becomes more p-type (the hole concentration increased). At the shorter times and lower temperatures within these ranges, this effect is confined to a surface layer but at longer times and higher temperatures, the resultant carrier concentration change is seen through the bulk of the material. For example, a 0.25 millimeter thick slice of material is changed by more than a factor of 10 through its bulk in a heat treatment at 50 percent of its centigrade melting point in 30 minutes. Heat treatment of the contemplated materials at a temperature less than 35 percent of their centigrade melting points for less than two minutes results in less than an order of magnitude change in the carrier concentration over any useful depth in the treated device. When bulk effects are desired treatment times of 30 minutes or more are employed at temperatures of 50 percent of the samples centigrade melting point or greater. At these temperatures no further changes are observed for treatment times greater than 24 hours in device thickness slices ($\approx$ 1 mm or less). However, treatment at temperatures greater than 85 percent of the samples centigrade melting point may cause deterioration of the slice material. Heat treatments under an overpressure of one or both of the cations (the Groups I and III constituents) makes the carrier concentration of the treated material more n-type under the same conditions and limitations described above. This effect includes the reduction of the hole concentration and the production of a net electron carrier concentration.

FIG. 1 shows an exemplary heat treatment apparatus in which the slice of the material to be heat treated 11 is contained in a sealed quartz ampoule 12, together with powdered materials 13 which vaporize sufficiently to provide the desired heat treatment atmosphere. Heating coil 14 is provided to raise the temperature of the ampoule 12 to the desired heat treatment temperature. In addition to the cation and anion species desired to provide an overpressure, the powdered materials 13 may also include powdered semi-conductors of the same composition as the slice 11 to be treated, or a combination of elements of the same stoichiometry as the slice 11 material. The inclusion of such material serves to inhibit the deterioration of the surface of the slice 11. Table II shows, for some exemplary materials, the extremes of p-type and n-type conductivity which had been realized by heat treatments in maximum anion or cation overpressures. These maximum concentrations are produced by including the anion or cation species in an amount sufficient to insure its continued presence in solid or liquid form.

Additional control of the conductivity of these materials is obtained by including dopant species in the heat treatment atmosphere or in the bulk during growth. If these dopants are to be included during heat treatment they are included in the powdered materials 13. Even if these dopants are included in the bulk during crystal growth it has still been found desirable to heat treat the material in the manner of the invention to achieve the desired electrical carrier concentrations. In one exemplary process, which will be more fully presented below, high conductivity n-type $CuInS_2$ was made by including cadmium along with the cation overpressure. The p-type dopants contemplated here included N, P, As, and Sb whereas the n-type dopants included C, Si, Ge, Sn, Zn, Cd, Cl, Br, and I.

TABLE II

| Material | Conductivity Type, Resistivity, and Mobility After Heat Treating<br>Maximum Anion Overpressure | Maximum Cation Overpressure |
|---|---|---|
| $CuAlS_2$ | p-type $\rho=10^3$ Ω-cm | semi-insulating |
| $CuAlSe_2$ | p-type $\rho=500$ Ω-cm, $\mu_h\sim1$ $cm^2$/volt sec | semi-insulating |
| $CuGaS_2$ | p-type $\rho=1$ Ω-cm, $\mu_h\sim20$ $cm^2$/volt sec | semi-insulating |
| $CuInS_2$ | p-type $\rho=5$ Ω-cm, $\mu_h=15$ $cm^2$/volt sec | n-type $\rho\sim1$ Ω-cm $\mu_e\sim200$ $cm^2$/volt sec |
| $CuInSe_2$ | p-type $\rho$–0.5 Ω-cm, $\mu_h\sim10$ $cm^2$/volt sec | n-type $\rho=0.05$ Ω-cm $\mu_e=320$ $cm^2$/volt sec |

P-n homojunction devices are made using materials which can be made both p- and n-type. This is accomplished in the contemplated materials using two heat treatment steps. Heat treatment of these materials at temperatures greater than 50 percent of their centigrade melting points for times greater than 30 minutes causes at least 0.25 millimeters of the bulk of the slice to take on its desired p- or n-type character, this character being determined by the anion or cation overpressure. A subsequent heat treatment with an opposite overpressure at a temperature between 35 percent and 50 percent of their centigrade melting points for substantially less time than the first heat treatment converts a surface layer less than 0.1 mm thick to the opposite conductivity producing a p-n junction within the material.

p-n heterojunction devices are produced using these materials together with other materials possessing a sufficiently good lattice match to permit epitaxial growth. The other materials chosen must, in addition, be capable of exhibiting the opposite conductivity type. One class of materials which is particularly suited for use, together with the Group I-III-VI semiconductors is the Group II-VI semiconductors. These materials crystallize in structures similar to that of the Group I-III-VI materials and several possess a close lattice match with corresponding Group I-III-VI materials. For example, $CuGaS_2$ and ZnS are matched within one percent; $CuAlSe_2$ and ZnSe are matched within one percent; and $CuAlS_2$ and ZnS are matched within two percent.

To achieve epitaxial growth of sufficiently high quality it is desirable that the lattice match be better than three percent. The Group II-VI materials also fulfill the other requirement. All of the materials possessing a close lattice match with the Group I-III-VI materials are strongly n-type, whereas all of the Group I-III-VI materials contemplated are controllably p-type.

Figure 2:
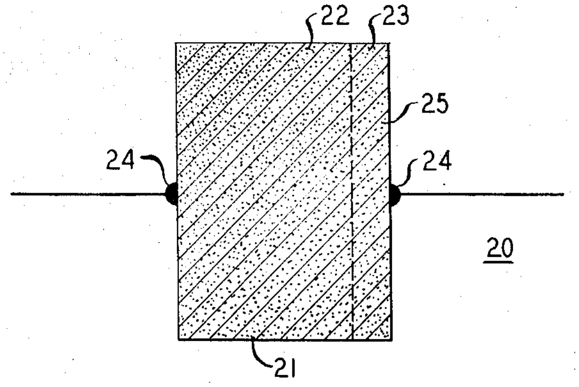
FIG. 2 is a sectional view of an exemplary diode processed in accordance with the invention.

FIG. 2 shows a semiconductor device 20 including a Group I-III-VI compound semiconductor portion whose conductivity has been controlled by the disclosed heat treatment. The device 20 has at least two electrical contacts 24, shown schematically and a semiconductor portion 21 which may be separated into two regions 22, 23 of differing electrical properties. One such contemplated device is a p-n junction diode where the two regions 22, 23 are composed of the same Group I-III-VI material or, alternatively, two different materials, one grown epitaxially on the other.

EXAMPLES

1. A 0.25 millimeter thick slice of $CuInS_2$ was placed in a 3 $cm^3$ quartz ampoule together with 50 mg of powdered $S_2$. The ampoule was evacuated and sealed then heated to 705°C and maintained at that temperature for 24 hours. Before heat treatment the slice was p-type with a resistivity of $10^5$ (Ω-cm) and a carrier concentration of $3 \times 10^{12}$ per $cm^3$. After heat treatment the slice was p-type with a resistivity of 3 (Ω-cm) and a carrier concentration of $1 \times 10^{17}$ per $cm^3$.
2. A 0.25 millimeter thick slice of $CuInS_2$ was placed in a 3 $cm^3$ quartz ampoule together with 1 mg Cu and 1 mg In and 3 to 5 mg of powdered $CuInS_2$. The ampoule was evacuated and sealed then heated to 750°C and maintained at that temperature for 24 hours. Before heat treatment the slice was p-type with a resistivity of $10^5$ (Ω-cm) and a carrier concentration of $3 \times 10^{12}$ per $cm^3$. After heat treatment the slice was n-type with a resistivity of 1 (Ω-cm) and a carrier concentration of $5 \times 10^{16}$ per $cm^3$.
3. A 0.25 millimeter thick crystal of $CuInS_2$ was placed in a 3 $cm^3$ quartz ampoule together with 1 mg Cu + 1 mg In + 3–5 mg $CuInS_2$ (powdered) + 1 mg Cd. The ampoule was evacuated, sealed and heated to 750°C for ≈ 24 hours. Before heat treatment, the crystal was p-type with resistivity ≈ $10^5$ Ω-cm. After heat treatment it was n-type with $\rho \approx$ 100 (Ω-cm) with carrier concentration $5 \times 10^{18}$ $cm^{-3}$.
4. A series of 0.5 millimeter thick samples of $CuInS_2$ were placed in a 3 $cm^3$ quartz ampoule with 50 mg of S and heat treated at 750°C for 24 hours. After removing, the crystal resistivity was ≈ 3 Ω-cm p-type. The crystals were then reannealed at 550° – 600°C in 1 mg Cu + 1 mg In + 3 to 5 mg powdered $CuInS_2$. The annealing time for the second anneal was ≈ 5 minutes, and gives an n-type layer on the p-type crystal extending ≈ 0.1 mm. The conductivity of the layer was increased as the temperature was increased from 550° to 600°C, and times less than five minutes reduce the n-layer thickness, while longer times increase the thickness.

What is claimed is:

1. A method for the fabrication of a semiconducting device, at least one portion of which device is a Group I-III-VI compound semiconductor consisting primarily of Cu, A Group I element, and at least one member of the group consisting of Al, Ga and In, each being a Group II element, and one member of the group consisting of S, Se and Te, each being a Group VI element, which method comprises processing the as-formed semiconductor characterized in that the processing includes a heat treatment at a temperature between 35 percent and 85 percent of the centigrade melting point of the semiconductor for a time greater than two minutes together with a vapor possessing an over-pressure of at least 10 percent of the saturation pressure of at least one of the constituent elements so as to change the sign of the electrical conductivity type of the device.

2. A method of claim 1 in which the overpressure consists essentially of at least one of the Group I and the Group III elements contained within the device which heat treatment causes the electrical carrier concentration to become n-type.

3. A method of claim 2 in which the heat treatment takes place at a heat treatment temperature greater than 50 percent of the centigrade melting point of the semiconductor for a heat treatment time greater than 30 minutes sufficient to reduce the hole concentration by at least a factor of 10 throughout the device.

4. A method of claim 3 in which the vapor includes an n-type dopant species.

5. A method of claim 3 in which the processing includes a second heat treatment in which a second overpressure consists essentially of the Group VI element contained within the device and which takes place at a second heat treatment temperature between 35 and 50 percent of the centigrade melting point of the semiconductor for a second heat treatment time less than 30 minutes sufficient to convert only a surface layer region of the device to more p-like conductivity with an increase in the concentration of hole carriers by at least a factor of 10.

6. A method of claim 5 in which the Group I-III-VI compound semiconductor is one member selected from the group consisting of $CuInS_2$ and $CuInSe_2$.

7. A method of claim 5 in which the vapor contains a p-type dopant species during the second heat treatment.

8. A method of claim 1 in which the overpressure consists essentially of the Group VI element contained within the device which heat treatment causes the electrical carrier concentration to become p-type.

9. A method of claim 8 in which the heat treatment takes place at a heat treatment temperature greater than 50 percent of the centigrade melting point of the semiconductor for a heat treatment time greater than 30 minutes sufficient to increase the hole concentration by at least a factor of 10 throughout the device.

10. A method of claim 9 in which the vapor includes a p-type dopant species.

11. A method of claim 8 in which the device includes a Group II-VI compound semiconductor portion in which one of the Group I-III-VI compound semiconductor and the Group II-VI compound semiconductor portions is grown epitaxially on the other.

12. A method of claim 11 in which the portions possess lattice constants in the epitaxial growth plane which are the same within three percent.

13. A method of claim 12 in which the portions are $CuGaS_2$ and ZnS.

14. A method of claim 12 in which the portions are respectively $CuAlSe_2$ and ZnSe.

15. A method of claim 12 in which the portions are respectively $CuAlS_2$ and ZnS.

16. A method of claim 8 in which the processing includes a second heat treatment in which a second overpressure consists essentially of at least one of the Group I and the Group III elements contained within the device and which takes place at a second heat treatment temperature between 35 and 50 percent of the centigrade melting point of the semiconductor for a second heat treatment time less than 30 minutes such as to convert only a surface layer region of the device to more n-like conductivity with a decrease in the hole concentration by at least a factor of ten.

17. A method of claim 16 in the heat treatment time and second heat treatment time, and the heat treatment temperature and the second heat treatment temperature are chosen so as to produce a p-n junction within the Group I-III-VI compound semiconductor portion of the device.

18. A method of claim 17 in which the Group I-III-VI compound semiconductor is one member selected from the group consisting of $CuInS_2$ and $CuInSe_2$.

19. A semiconducting device produced by the method of claim 1.

* * * * *